(12) United States Patent
Roset et al.

(10) Patent No.: US 11,139,196 B2
(45) Date of Patent: Oct. 5, 2021

(54) SUBSTRATE HOLDER FOR USE IN A LITHOGRAPHIC APPARATUS

(71) Applicant: ASML NETHERLANDS B.V., Veldhoven (NL)

(72) Inventors: Niek Jacobus Johannes Roset, Eindhoven (NL); Marcus Martinus Petrus Adrianus Vermeulen, Leende (NL); Simon Karel Ravensbergen, Veldhoven (NL); Mark Constant Johannes Baggen, Eindhoven (NL); Gijs Kramer, Nijmegen (NL); Roger Anton Marie Timmermans, Nederweert (NL); Frank Pieter Albert Van Den Berkmortel, Deurne (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/650,939

(22) PCT Filed: Sep. 19, 2018

(86) PCT No.: PCT/EP2018/075293
§ 371 (c)(1),
(2) Date: Mar. 26, 2020

(87) PCT Pub. No.: WO2019/072504
PCT Pub. Date: Apr. 18, 2019

(65) Prior Publication Data
US 2020/0294841 A1 Sep. 17, 2020

(30) Foreign Application Priority Data
Oct. 12, 2017 (EP) .................................. 17196086
Mar. 26, 2018 (EP) .................................. 18163985

(51) Int. Cl.
G03F 7/20 (2006.01)
H01L 21/687 (2006.01)

(52) U.S. Cl.
CPC ...... *H01L 21/6875* (2013.01); *G03F 7/70341* (2013.01)

(58) Field of Classification Search
CPC ... G03F 7/70341; G03F 7/707; H01L 21/683; H01L 21/6875
See application file for complete search history.

(56) References Cited

U.S. PATENT DOCUMENTS 6,251,693 B1 6/2001 Nuttall et al.
6,952,253 B2 10/2005 Lof et al.
(Continued)

FOREIGN PATENT DOCUMENTS

CN 102290364 12/2011
CN 104698767 6/2015
(Continued)

OTHER PUBLICATIONS

International Search Report and Written Opinion issued in corresponding PCT Patent Application No. PCT/EP2018/075293, dated Nov. 26, 2018.
(Continued)

*Primary Examiner* — Steven Whitesell Gordon
(74) *Attorney, Agent, or Firm* — Pillsbury Winthrop Shaw Pittman, LLP

(57) ABSTRACT

A substrate holder for use in a lithographic apparatus and configured to support a substrate, the substrate holder having a main body having a main body surface, a plurality of main burls projecting from the main body surface, wherein each main burl has a distal end surface configured to support the substrate, a first seal member projecting from the main body surface and having an upper surface, the first seal member
(Continued)

surrounding the plurality of main burls and configured to restrict the passage of liquid between the substrate and the main body surface radially inward past the first seal member, and a plurality of minor burls projecting from the upper surface of the first seal member, wherein each minor burl has a distal end surface configured to support the substrate.

20 Claims, 8 Drawing Sheets

(56) References Cited

U.S. PATENT DOCUMENTS

| | | | |
|---|---|---|---|
| 9,287,183 | B1 | 3/2016 | Zhao et al. |
| 2003/0084918 | A1 | 5/2003 | Kim |
| 2004/0007325 | A1 | 1/2004 | Pan et al. |
| 2004/0036850 | A1 | 2/2004 | Tsukamoto et al. |
| 2004/0160582 | A1 | 8/2004 | Lof et al. |
| 2005/0122505 | A1 | 6/2005 | Miyajima |
| 2005/0219488 | A1 | 10/2005 | Nei et al. |
| 2005/0264778 | A1 | 12/2005 | Lof et al. |
| 2006/0132737 | A1 | 6/2006 | Magome et al. |
| 2006/0139614 | A1 | 6/2006 | Owa et al. |
| 2007/0008508 | A1 | 1/2007 | Lin et al. |
| 2007/0109521 | A1 | 5/2007 | Nishii et al. |
| 2007/0146665 | A1 | 6/2007 | Ottens et al. |
| 2007/0177125 | A1 | 8/2007 | Shibazaki |
| 2007/0195306 | A1* | 8/2007 | Yun .................. G03F 7/707 355/73 |
| 2007/0258080 | A1 | 11/2007 | Van den Brink et al. |
| 2008/0002163 | A1 | 1/2008 | Fujiwara et al. |
| 2008/0043210 | A1 | 2/2008 | Shibuta |
| 2008/0111984 | A1 | 5/2008 | Shibuta |
| 2008/0117394 | A1 | 5/2008 | Owa et al. |
| 2008/0165330 | A1 | 7/2008 | Mizutani |
| 2008/0202555 | A1 | 8/2008 | Shibazaki |
| 2008/0239275 | A1* | 10/2008 | Mizutani .......... H01L 21/6875 355/73 |
| 2008/0297744 | A1 | 12/2008 | De Jong et al. |
| 2009/0284715 | A1 | 11/2009 | Watso et al. |
| 2009/0296056 | A1 | 12/2009 | Mondt et al. |
| 2010/0141924 | A1 | 6/2010 | Shibazaki |
| 2011/0267592 | A1 | 11/2011 | Ottens et al. |
| 2013/0057838 | A1 | 3/2013 | Sato |
| 2013/0094005 | A1 | 4/2013 | Kunnen et al. |
| 2014/0166050 | A1 | 6/2014 | Kelekar et al. |
| 2015/0131064 | A1 | 5/2015 | Laurent et al. |
| 2016/0187791 | A1* | 6/2016 | Houben ............. H01L 21/6875 355/72 |
| 2016/0282727 | A1 | 9/2016 | Lof et al. |
| 2016/0334710 | A1 | 11/2016 | Houben et al. |
| 2019/0163066 | A1* | 5/2019 | Kramer ............. G03F 7/70341 |

FOREIGN PATENT DOCUMENTS

| | | | |
|---|---|---|---|
| EP | 1429188 | | 6/2004 |
| EP | 1641028 | | 3/2006 |
| EP | 1801850 | | 6/2007 |
| EP | 1962329 | | 8/2008 |
| JP | H08279549 | | 10/1996 |
| JP | 2004-289127 | A | 10/2004 |
| JP | 2005191557 | | 7/2005 |
| JP | 2005259870 | | 9/2005 |
| JP | 2005310933 | | 11/2005 |
| JP | 2006310588 | | 11/2006 |
| JP | 2012-164996 | A | 8/2012 |
| TW | 438903 | | 6/2001 |
| TW | 201533838 | | 9/2015 |
| WO | 99/49504 | | 9/1999 |
| WO | 2005059977 | | 6/2005 |
| WO | 2006/030908 | A1 | 3/2006 |
| WO | 2007007723 | | 1/2007 |
| WO | 2007083592 | | 6/2007 |
| WO | WO-2007083592 | A1 * | 7/2007 ......... H01L 21/6875 |
| WO | 2015043890 | | 4/2015 |
| WO | 2016020170 | | 2/2016 |
| WO | 2017054991 | | 4/2017 |
| WO | I2017102162 | | 6/2017 |

OTHER PUBLICATIONS

Search Report dated Feb. 9, 2021, issued in corresponding Singapore Application No. 11202002228U (2 pgs.).

Notice of Reasons for Rejection dated Jun. 15, 2021, issued in corresponding Japanese Patent Application No. 2020-516431 with English machine translation (9 pgs.).

* cited by examiner

SUBSTRATE HOLDER FOR USE IN A LITHOGRAPHIC APPARATUS

CROSS-REFERENCE TO RELATED APPLICATIONS

This application is the U.S. national phase entry of PCT Patent Application No. PCT/EP2018/075293, filed Sep. 19, 2018, which claims the benefit of priority of European Patent Application No. 17196086.7, which was filed on Oct. 12, 2017 and of European Patent Application No. 18163985.7, which was filed on Mar. 26, 2018, each of which are incorporated herein in their entirety by reference.

FIELD

The present invention relates to a substrate holder for use in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In an immersion lithographic apparatus an immersion liquid is interposed in a space between a projection system of the apparatus and a substrate. This immersion liquid can find its way past the edge of the substrate to an under surface of the substrate. This can be deleterious due to contamination of the under surface of the substrate resulting from this immersion liquid and/or due to thermal loads applied to the under surface of the substrate at positions close to the edge of the substrate, due to evaporation of the immersion liquid. A substrate holder which is configured to support the substrate can have features which reduce the quantity and/or distance the immersion liquid moves radially inwardly along the under surface of the substrate. Such features can deleteriously effect the achieved flatness and cleanliness of the substrate as well as the ease of removal.

SUMMARY

It is an object of the present invention to provide a substrate holder with an acceptable compromise between performance of the substrate holder in terms of flatness and cleanliness of the substrate and reduction of the passage of the immersion liquid along the under surface of the substrate.

In an embodiment of the present invention there is provided a substrate holder for use in a lithographic apparatus and configured to support a substrate, the substrate holder comprising: a main body having a main body surface; a plurality of main burls projecting from the main body surface, wherein each main burl has a distal end surface configured to support the substrate: a first seal member projecting from the main body surface and having an upper surface, the first seal member surrounding the plurality of main burls and configured to restrict the passage of liquid between the substrate and the main body surface radially inward past the first seal member; and a plurality of minor burls projecting from the upper surface of the first seal member, wherein each minor burl has a distal end surface configured to support the substrate.

In an embodiment of the present invention, there is provided a substrate holder for use in a lithographic apparatus and configured to support a substrate, the substrate holder comprising: a main body having a main body surface; a plurality of main burls projecting from the main body surface, wherein each main burl has a distal end surface configured to support the substrate: a first seal member projecting from the main body surface and having an upper surface, the first seal member surrounding the plurality of main burls and configured to restrict the passage of liquid between the substrate and the main body surface radially inward past the first seal member; a second seal member projecting from the main body surface, the second seal member surrounding the first seal member and configured for restricting the passage of liquid between the substrate and the main body surface radially inward past the second seal member; a plurality of extraction openings formed in the main body between the first seal member and the second seal member for the extraction of fluid into the main body from between the main body and the substrate; and a plurality of outer burls projecting from the main body surface between the first seal member and the second seal member, each outer burl having a distal end surface configured to support the substrate; wherein the plurality of outer burls and the plurality of extraction openings are arranged alternately in a line surrounding the first seal member and the plurality of main burls.

In an embodiment of the present invention, there is provided a substrate holder for use in a lithographic apparatus and configured to support a substrate, the substrate holder comprising: a main body having a main body surface; a plurality of main burls projecting from the main body surface, wherein each main burl has a distal end surface configured to support the substrate: a first seal member projecting from the main body surface and having an upper surface, the first seal member surrounding the plurality of main burls and configured to restrict the passage of liquid between the substrate and the main body surface radially inward past the first seal member; a plurality of minor burls projecting from the upper surface of the first seal member, wherein each minor burl has a distal end surface configured to support the substrate;

a second seal member projecting from the main body surface, the second seal member surrounding the first seal member and configured for restricting the passage of liquid between the substrate and the main body surface radially inward past the second seal member; a third seal member projecting from the main body surface, the third seal member surrounding the first seal member and the second seal member and configured for restricting the passage of liquid between the substrate and the main body surface radially inward past the third seal member; a plurality of inlet openings formed in the main body between the first seal member and the second seal member; and a plurality of extraction openings formed in the main body between the second seal member and the third seal member for the extraction of fluid into the main body from between the main body and the substrate.

In an embodiment of the present invention, there is provided a substrate holder for use in a lithographic apparatus and configured to support a substrate, the substrate holder comprising: a main body having a main body surface; a plurality of main burls projecting from the main body surface, wherein each main burl has a distal end surface configured to support the substrate; a seal member projecting from the main body surface and having an upper surface, the seal member surrounding the plurality of main burls; a plurality of extraction openings formed in one or more first recesses in the upper surface of the seal member; a plurality of inlet openings formed in one or more second recesses in the upper surface of the seal member; a barrier between the one or more first recesses and the one or more second recesses and configured to restrict the passage of liquid between the substrate and the main body surface radially inward past the barrier.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
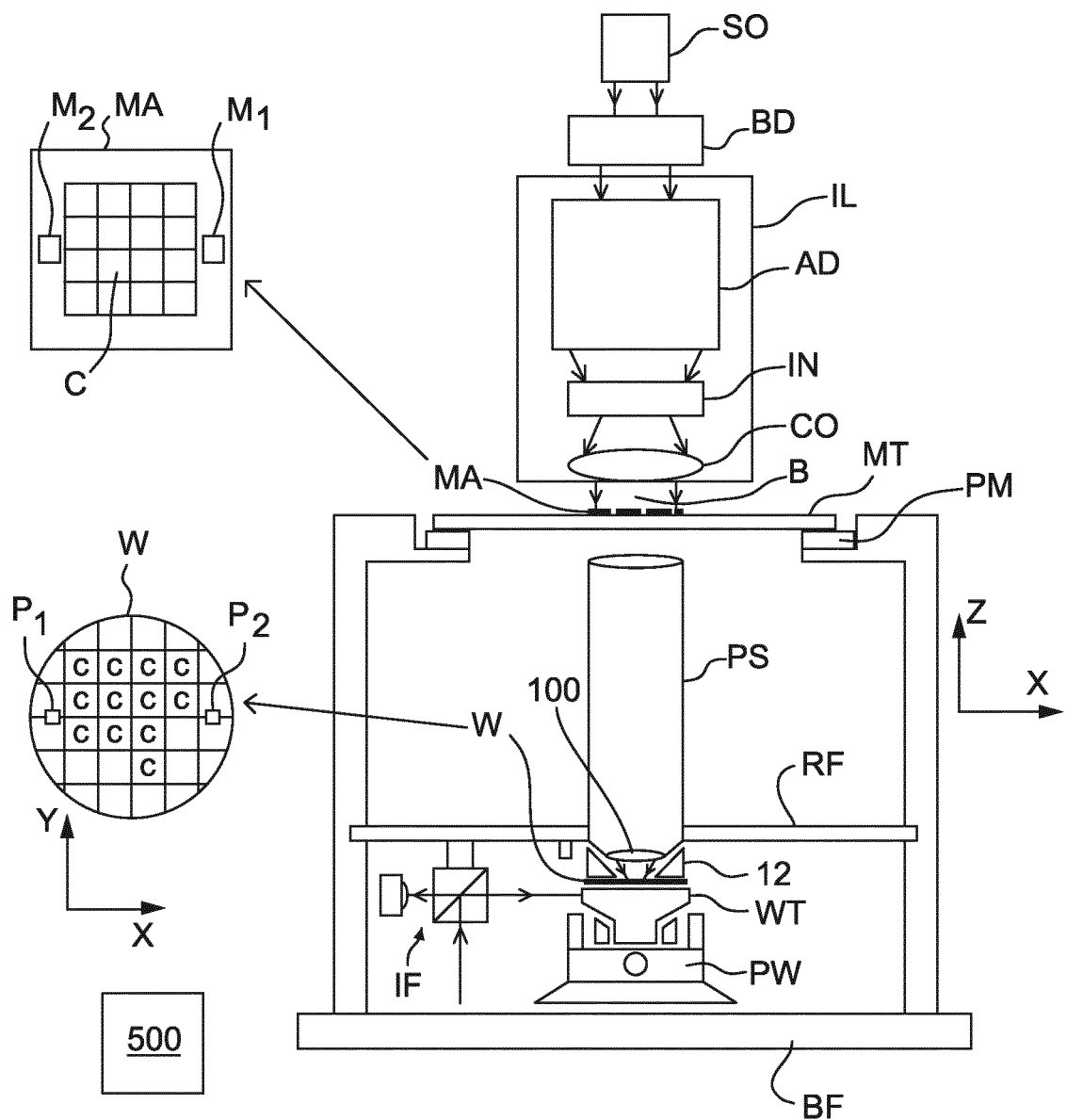
FIG. 1 depicts a schematic overview of a lithographic apparatus.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by an immersion liquid having a relatively high refractive index, e.g., water, so as to fill a space 11 between the projection system PS and the substrate W—which is also referred to as immersion lithography. More information on immersion techniques is given in U.S. Pat. No. 6,952,253, which is incorporated herein by reference.

The lithographic apparatus may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in a space 11 between a projection system of the apparatus (through which the patterned beam is projected towards the substrate W) and the substrate W. The immersion liquid covers at least the part of the substrate under a final element of the projection system PS. Thus, at least the portion of the substrate W undergoing exposure is immersed in the immersion liquid. The effect of the immersion liquid is to enable imaging of smaller features since the exposure radiation will have a shorter wavelength in the liquid than gas. (The effect of the immersion liquid may also be regarded as increasing the effective numerical aperture (NA) of the system and also increasing the depth of focus.)

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space 11 between the final element and a surface facing the final element. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The space 11 filled by the immersion liquid is smaller in plan than the top surface of the substrate W and the space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the space 11 and which operate depending on the relative motion of the stage beneath the projection system PS. In more recent designs, the fluid handling structure extends along at least a part of a boundary of the space 11 between the final element of the projection system PS and the substrate support WT or substrate W, so as to in part define the space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system fluid removal system, liquid confinement structure, etc.

As a barrier member, the fluid handling structure 12 is a barrier to the flow of the immersion liquid from the space 11. As a liquid confinement structure, the structure confines the immersion liquid to the space 11. As a seal member, sealing features of the fluid handling structure form a seal to confine the immersion liquid to the space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element is at least partly surrounded by the fluid handling structure 12. The fluid handling structure 12 may confine the immersion liquid under the final element and above the facing surface.

Figure 2A:
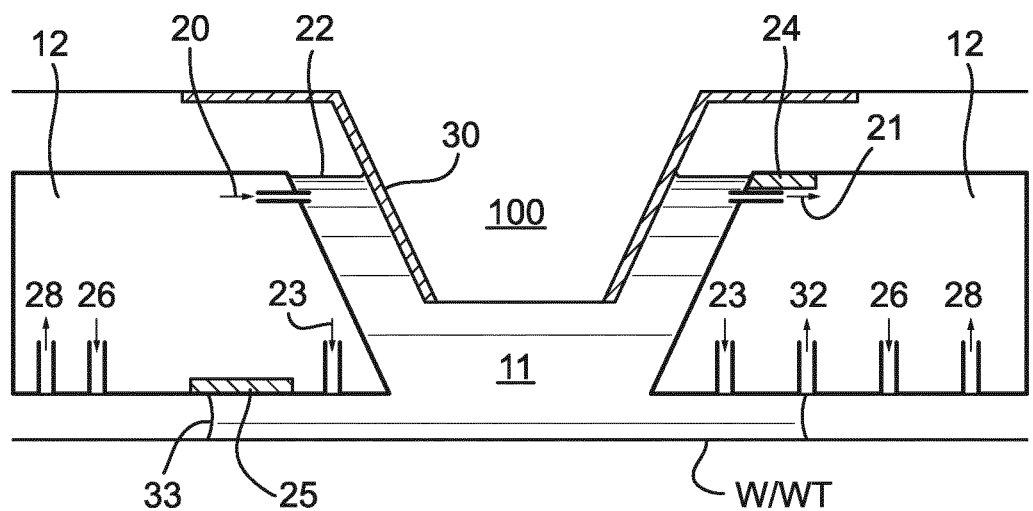
FIGS. 2a and 2b depict, in cross section, two different versions of a fluid handling structure with different features illustrated on the left hand side and the right hand side, which may extend around the complete circumference.
Figure 2B:
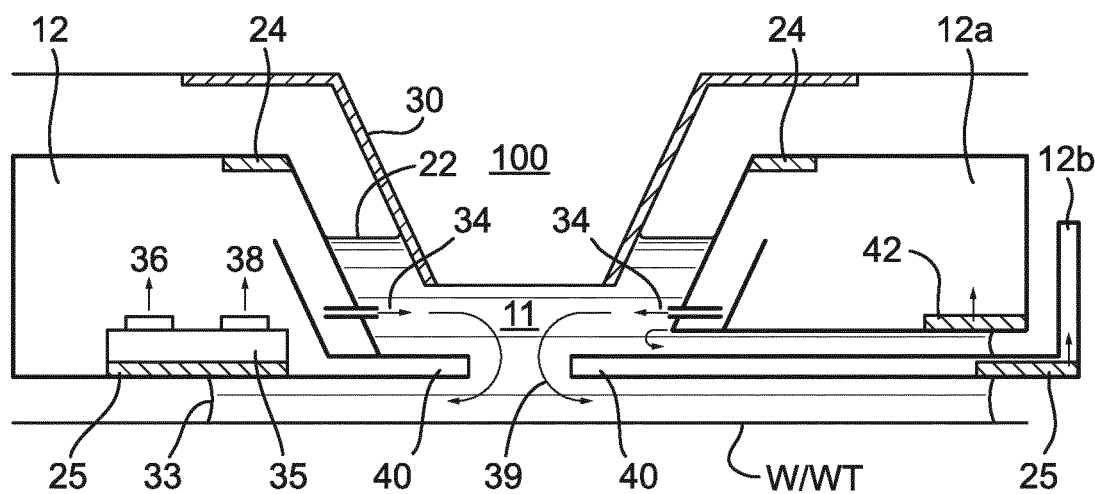

FIGS. 2a and 2b show different features which may be present in variations of fluid handling structure 12. The designs may share some of the same features as FIGS. 2a and 2b unless described differently. The features described herein may be selected individually or in combination as shown or as required.

FIG. 2a shows a fluid handling structure 12 around the bottom surface of a final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface have complementary shape. A top surface of the fluid handling structure 12 is substantially planar. The fluid handling structure 12 may fit around the frusto-conical shape of the final element 100. A bottom surface of the fluid handling structure 12 is substantially planar and in use the bottom surface may be parallel with the facing surface of the substrate support WT and/or substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. A space 11 is therefore defined between the inner surface of the fluid handling structure 12, the planar surface of the frusto-conical portion and the facing surface. During use, the space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the undersurface of the fluid handling structure 12. The under supply opening 23 may surround the path of the radiation beam B and it may be formed of a series of openings in an array. The immersion liquid is supplied to fill the space 11 so that flow through the space 11 under the projection system PS is laminar. The supply of the immersion liquid from the opening 23 under the fluid handling structure 12 additionally prevents the ingress of bubbles into the space 11. This supply of the immersion liquid functions as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the space 11; or the recovery may be as a consequence of both. The recovery opening 21 may be located on the opposite side of the supply opening 20, when viewed in plan. Additionally or alternatively, the immersion liquid may be recovered through an overflow opening 24 located on the top surface of the fluid handling structure 12. In an embodiment, the supply and recovery openings 20, 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold (or 'pin') a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pining openings 32 through which the immersion liquid is recovered. The pining openings 32 may recover the immersion liquid in a two phase flow.

Optionally radially outward, with respect to the inner-surface of the fluid handling structure 12, is an gas knife opening 26. Gas may be supplied through the gas knife opening 26 at elevated speed to assist liquid confinement of the immersion liquid in the space 11. The supplied gas may be humidified and it may contain substantially carbon dioxide. Radially outward of the gas knife opening 26 is a gas recovery opening 28 for recovering the gas supplied through the gas knife opening 26. Further openings, for example open to atmosphere or to a gas source, may be present in the bottom surface of the fluid handling structure 12. For example, further openings may be present between gas knife opening 26 and gas recovery opening 28 and/or between pining openings 32 and gas knife opening 26.

Features shown in FIG. 2b which are common to FIG. 2a share the same reference numbers. The fluid handling structure 12 has an inner surface which complements the conical surface of the frusto-conical shape. The undersurface of the fluid handling structure 12 is closer to the facing surface than the bottom planar surface of the frusto-conical shape.

Immersion liquid is supplied to the space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the space 11 through recovery openings 25 in the undersurface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. In an embodiment the immersion liquid is recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the undersurface of fluid handling structure 12 extends into the space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

In an embodiment the fluid handling structure 12 may be in two parts as shown on the right hand side of FIG. 2b: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

Figure 3:
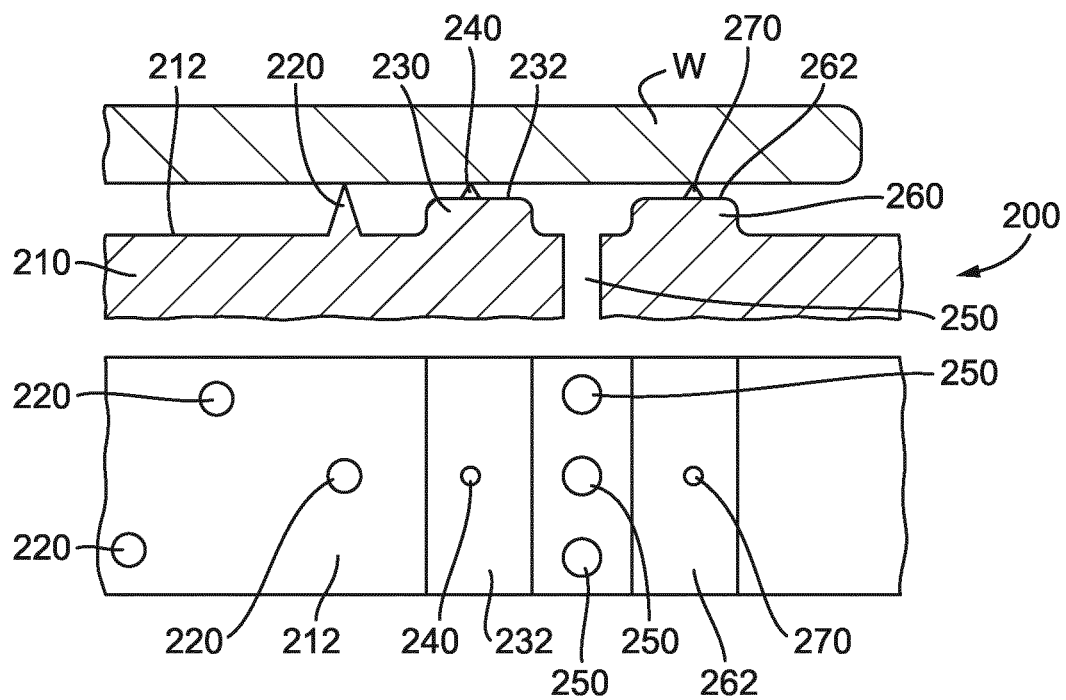
FIG. 3 depicts a schematic overview of an edge of a substrate holder 200 according to the present invention.

The substrate support WT comprises a substrate holder 200 which is configured to support the substrate W. FIG. 3 illustrates, in cross-section in an upper portion and in plan in a lower portion, an edge region of the substrate holder 200 and the associated substrate W (in the upper part) according to an embodiment. The substrate holder 200 comprises a main body 210 having a main body surface 212. In use the main body surface 212 faces an under surface of the substrate W.

In a central region of the main body surface 212 (to the left hand side in FIG. 3), a plurality of main burls 220 project from the main body surface 212. Each main burl 220 has a distal end surface configured to support the substrate W. The main burls 220 are arranged relative to another in a pattern, in plan. The pattern is such as to support the substrate W and to reduce any bowing of the substrate W towards the main body surface 212 to an acceptable amount.

The area in plan of each main burl 220 is relatively small compared to the area, in plan, of the substrate W. Therefore the main burls 220 contact only a small area of the under surface of the substrate W. This reduces the opportunity for contamination to be transferred from the substrate holder 200 to the substrate W.

A pressure differential across the substrate W is established. For example, the space between the main body 210 of the substrate holder 200 and the substrate W is connected to an under pressure that is lower than a higher pressure above the substrate W. The pressure difference gives rise to a force holding the substrate W to the substrate holder 200.

In an immersion lithographic apparatus, liquid will, at least at certain times during exposure of the substrate W, be present adjacent an edge of the substrate W. Due to the under pressure between the main body 210 of the substrate holder 200 and the under surface of the substrate W, this liquid will be drawn in around the edge of the substrate W and under the substrate W. In order to reduce occurrence of liquid being in contact with the under surface of the substrate W and especially at the area where main burls 220 contact with the substrate W, a first seal member 230 projecting from the main body surface 212 of the main body 210 is provided. The first seal member 230 surrounds the plurality of main burls 212. The first seal member 230 is configured to restrict the passage of liquid between the substrate W and the main body surface 212 radially inward past the first seal member 230. The first seal member 230 is a continuous (though not necessarily uniform in cross-section) barrier surrounding the main burls 220.

One purpose of the first seal member 230 is to limit the flow of gas (which may undesirably be humid) radially inward towards the main burls 220. This enables the under pressure to be generated around the main burls 220 which is necessary for clamping the substrate W to the substrate holder 200. It is advantageous to allow some flow of gas over the first seal member 230 so that when the under pressure source which generates the under pressure around the main burls 220 is switched off, the substrate W can quickly be removed from the substrate holder 200. If the gas flow is too low past the first seal member 230, then the time taken for the pressure around the main burls 220 to equalise with the pressure above the substrate W, thereby releasing the substrate W, is too high.

The first seal member 230 has an upper surface 232 which is configured, in use, to form a gap between it and the under surface of the substrate W. That is, the upper surface 232 is configured to be somewhat closer to the main body surface 212 than the distal end surface of the main burls 220. This is advantageous because this arrangement allows for gas to be drawn in over the first seal member 230 (under the substrate W) just before substrate W removal whilst allowing restriction of the passage of liquid in the same direction. This is achieved without contacting a large area of the under surface of the substrate W which would lead deleteriously to transfer of contamination from the first seal member 230 to the substrate W. This would also make removal of the substrate W from the substrate holder 200 more problematic.

The cross-sectional area of the first seal member 230, in plan, is very much greater than that of the main burls 220. The relatively large area, in plan, of the first seal member 230 results in a greater resistance to the passage of liquid between the substrate W and the main body surface 212 radially inward past the first seal member 230.

As can be seen in FIG. 3, the main burl 220 which is the most radially outward of the plurality of main burls 220, is quite a distance from the edge of the substrate W. In the absence of any other features supporting the substrate W radially outward of the most radially outward main burl 220, bending of an edge of the substrate W downwards can occur. This is due to the under pressure underneath the substrate W compared to above the substrate W. In the present invention, in order to support the substrate W radially outward of the radially outward most main burl 220, a plurality minor burls 240 are provided. The minor burls 240 project from the upper surface 232 of the first seal member 230. Each minor burl 240 has a distal end surface configured to support the substrate W.

The plurality of minor burls 240 are provided circumferentially along the first seal member 230. The plurality of minor burls 240 may be spaced apart. The plurality of minor burls 240 may all be at the same or at different radial distances from the centre of the substrate holder 200. The cross-sectional area, in plan, of each minor burl 240 is very much less than that of the first seal member 220. For instance, the sum of the cross-sectional areas of the plurality of minor burls 240 on the first seal member 230 is very much less than the total cross-sectional area of the first seal member 230, for example at least 10 or 15 times less.

Radially outwardly of the first seal member 230 are a plurality of extraction openings 250. The extraction openings 250 are formed in the main body 210. The extraction openings 250 are connected to an under pressure source. Thereby any liquid which reaches the extraction openings 250 is extracted through the main body 210. This means that the liquid is restricted from entering further into the space between the main body surface 212 and the substrate W. The extraction openings 250 can also extract gas, for example when there is no liquid present to be extracted. A mixture of liquid and gas can be extracted through the extraction openings 250.

The extraction openings 250 are spaced apart from one another all the way around the first seal member 230. Although the extraction openings 250 are illustrated in FIG. 3 as being discrete openings in the main body surface 212, this may not be the case. For example, a groove can be formed in the main body surface 212 and the extraction openings 250 can emerge from the main body 210 at the bottom of the groove. The groove may be segmented with one or more openings in each segment. The segments may be seen as a plurality of recesses.

By connecting the extraction openings 250 to an under pressure, liquid which does find its way to the edge of the substrate W can be removed through the extraction openings 250. Once the edge of the substrate W is no longer covered in liquid, the under surface of the substrate W is dried as the liquid is removed.

Radially outward of the extraction openings 250 is a second seal member 260. The second seal member 260 surrounds the extraction openings 250. The second seal member 260 also surrounds the first seal member 230.

The second seal member 260 may be similar to the first seal member 230 with an upper surface 262 from which a plurality of minor burls 270 project. An advantage of providing the plurality of minor burls 270 on the upper surface 262 of the second seal member 260 is that the substrate W is supported even closer to its edge. This further reduces deformation of the substrate W due to it edge being unsupported.

Although in the embodiment of FIG. 3 minor burls 240, 270 are shown on both of the first seal member 230 and second seal member 260, this may not be the case. For example, minor burls 240 may only project from the upper surface 232 of the first seal member 230 or minor burls 270 may only project from the upper surface 262 of the second seal member 260. In both cases deformation of the substrate W is reduced compared to the case where the minor burl 240, 270 is not present.

Although both first and second seal members 230, 260 are illustrated in FIG. 3, it may be that only the first seal member 230 or only the second seal member 260 is present. If only the second seal member 260 is present, this arrangement can be seen as having a first seal member with a plurality of extraction openings 250 radially inward of that first seal member. If the first seal member 230 radially inward of the extraction openings 250 is present in such an arrangement, this can be seen as being a second seal member.

In the embodiment of FIG. 3, in use, an under pressure in a central region of the substrate holder 200 between the main body surface 212 and the substrate W is provided. This under pressure is the reason the substrate W is clamped to the substrate holder 200. This clamping under pressure may have a lower magnitude (i.e. is a less severe vacuum) than the under pressure at a region adjacent the extraction openings 250. This arrangement results in a gas flow radially outward from a position around the main burls 220 towards the extraction openings 250 and a radially inward flow of fluid from the edge of the substrate W towards the extraction openings 250. In this way, because of the gas flow radially outwardly to a position adjacent the extraction openings 250, liquid and humidified gas is constrained from moving further radially inward than a position of the extraction openings 250. Thereby the extent of liquid penetration under the substrate W is reduced. Because the first seal member 230 does not have liquid on it or is not present, removing the substrate W from the substrate holder 200 is achieved more easily, resulting in less wear. Wear is deleterious because this can result in contamination of the substrate W as well as a change in the clamping characteristics of the substrate holder 200 and thereby deformation of the substrate W. The presence of liquid between main burls 220 and substrate W underside can also lead to wear (if the substrate holder 200 is a ceramic), and possibly friction variation. Deformation of the substrate W can lead to imaging errors (e.g. overlay errors and/or focus errors), as can contamination. The presence of liquid on the underside of the substrate W is generally deleterious because this can result in thermal stability issues of the substrate W or difficulties when liquid droplets are lost during unloading of the substrate W. Therefore the substrate holder 200 of FIG. 3 alleviates some of these difficulties by having in place extra support for the substrate edge, measures for maintaining the first seal member 230 dry and for preventing the ingress of liquid radially inward past the extraction openings 250. Additionally a humid atmosphere between the main body surface 212 and the substrate W is avoided by preventing the ingress of liquid past the extraction openings 250. The disadvantage of a humid atmosphere is the possibility of oxidation of the main burls 220. Oxidation of the main burls 220 is deleterious as this reduces the achievable flatness of the substrate W supported by the main burls 220.

Figure 4:
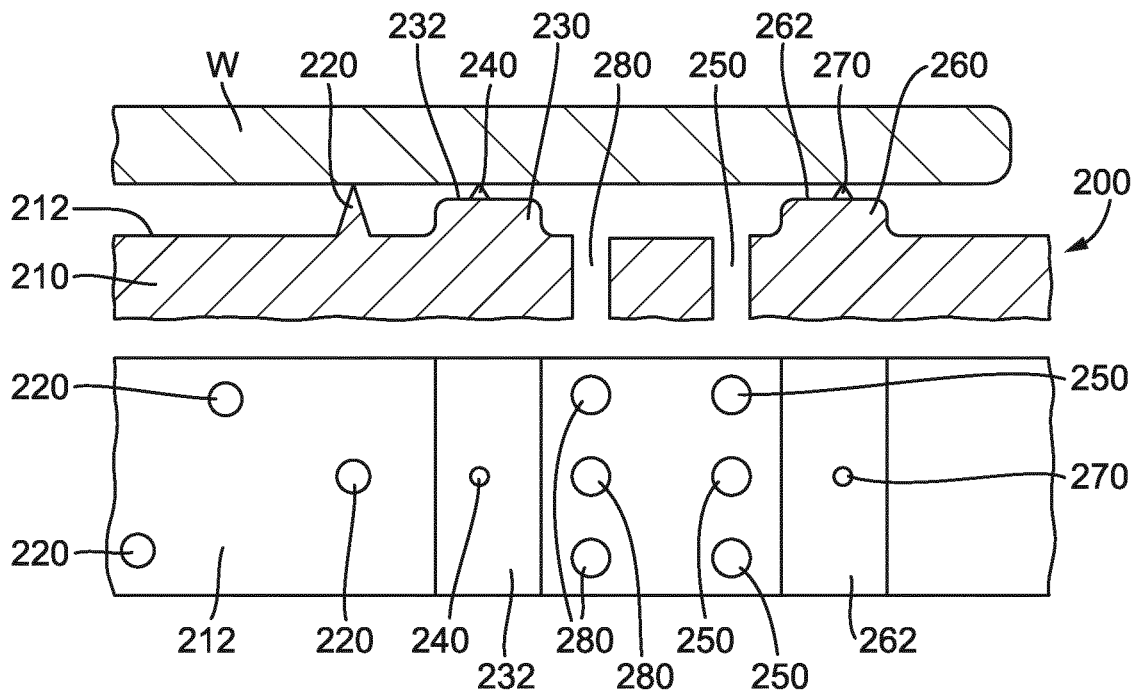
FIG. 4 depicts a schematic overview of an edge of a substrate holder 200 according to the present invention.

FIG. 4 shows another embodiment of a substrate holder 200 according to the present invention. The Figure shows, in cross-section in an upper portion and in plan in a lower portion, an edge region of the substrate holder 200. The embodiment of FIG. 4 is the same as that of FIG. 3 except as described below. Like reference numerals are used to illustrate corresponding features.

In the embodiment of FIG. 4, a plurality of inlet openings 280 are formed in the main body surface 212. The inlet openings 280 are radially inward of the extraction openings 250. The inlet openings 280 are open to the atmosphere or connected to a gas source. As a result, a flow of gas radially outward from the plurality of inlet openings 280 towards the plurality of extraction openings 250 is created. This flow of gas forms a barrier to the ingress of liquid and humid gas radially inwards under the substrate W. A flow of gas radially inwards from the plurality of inlet openings 280 is also created, due to the under pressure formed in the center of the substrate holder 200 for clamping the substrate W to the substrate holder 200. The under pressure generated in a center of the substrate holder 200 in a region of the main burls 220 may be of the same magnitude as the under pressure generated above the extraction openings 250. The under pressure at the extraction openings 250 may be deeper (i.e. have a greater magnitude) than that at main buds 220, causing a radially outward flow over the upper surface 232 as well.

Main burls 220 (and/or minor burls 270) may be arranged alternately with the inlet opening 280 or extraction opening 250 or between the inlet opening 280 and extraction opening 250, depending on the depth of the groove between the first seal member 230 and the second seal member 260.

The plurality of inlet openings 280 may be formed in the bottom of a groove in the main body surface 212. The groove may be in the form of a continuous or discontinuous circumferential channel. Alternatively the plurality of inlet openings 280 may be formed as a plurality of discrete openings in the main body surface 212, as illustrated. The number, size and spacing of the inlet openings 280 may be selected as appropriate. The number, size and spacing of the inlet openings 280 may be similar to that of the extraction openings 250, as illustrated.

Because the gas which exits the inlet openings 280 can be dehumidified gas, this further reduces the humidity of the gas present around the main burls 220. Alternatively in the case that gas exiting the inlet openings 280 is drawn towards the extraction openings 250, humidified gas can be provided out of the inlet openings 280. This reduces evaporation of liquid in the resulting gas flow, thereby reducing evaporative thermal load on the underside of the substrate W and/or in extraction openings 250 and further downstream. The provision of the inlet openings 280 also allows the under pressure connected to the extraction openings 250 to be the same as that of the under pressure surrounding the main burls 220. This is advantageous as the under pressure does not need to be lower than the under pressure surrounding the main burls 220 thereby drawing more liquid underneath the substrate W from the edge of the substrate W, as in the embodiment of FIG. 3.

In an embodiment, the gas flow radially inward towards the extraction openings 250 results in a superficial liquid flow and a superficial gas flow which find a balance. This means that liquid will flow down the outer side of the through hole forming the extraction opening 250 and gas will flow on the inner side of the through hole. If any liquid is present this type of two phase flow will occur and a smooth flow is achievable. Desirably in the case of no liquid being present, the under pressure which is determined by the flow restrictions of the inlet openings 280 and the second seal member 260, should be higher than the maximum capillary under pressure of the second seal 260. That is, the gas flow is great enough to overcome capillary pressure of liquid in the gap between the upper surface 262 and the substrate W. If this condition is met, then the gas flow over the second seal member 260 should always be enough to remove any liquid present between the upper surface 262 of the second seal member 260 and the substrate W. This is desirable as it allows removal of the substrate W without needing to overcome attraction to the substrate holder 200 due to liquid being present between the second seal member 260 and the substrate W. No liquid is present between the first seal member 230 and the substrate W, as described above. The absence of liquid between the first and second seal member 230, 260 and the substrate W will also increase flatness of the substrate W.

Figure 5:
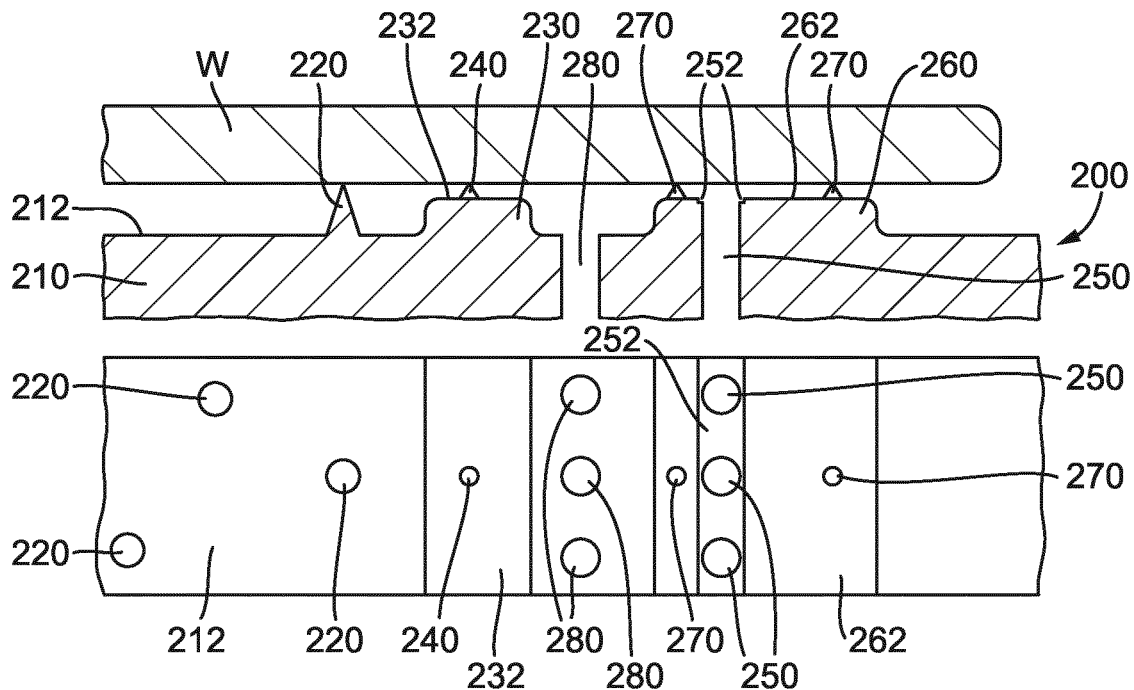
FIG. 5 depicts a schematic overview of an edge of a substrate holder 200 according to the present invention.

FIG. 5 illustrates a further embodiment which is the same as the embodiment of FIG. 4 except as described below.

In the embodiment of FIG. 5 the second seal member 260 has a larger width in the radial direction than that of the first seal member 230. The extraction openings 250 are formed in the upper surface 262 of the second seal member 260. As illustrated, a groove 252 is formed in the upper surface 262 of the second seal member 260 and the extraction openings 250 are formed in the bottom of the groove 252.

As illustrated in FIG. 5 two minor burls 270 are formed on the upper surface 262 of the second seal member 260, on either side of the extraction openings 250. Such minor burls 270 may or may not be present and they may be on only the radial inner side or only on the radial outer side of the extraction openings 250. The radial inner and outer minor burls 270 on the second seal member 260 may be lined up in the radial direction, as illustrated, or may be staggered relative to one another in the radial direction.

In one sense the embodiment of FIG. 5 can be seen as having three seal members, the first seal member 230, a seal member on the radially inward side of the extraction openings 250 and a third seal member radially outward of the extraction openings 250. This would be more apparent if the groove 252 were so deep that its bottom surface was substantially coplanar with the main body surface 212 of the main body 210. In this view it can be seen that the middle seal member is positioned between the inlet openings 280 and the extraction openings 250 as well as between the first seal member 230 and the second seal member 260.

Main burls 220 (and/or minor burls 270) may be arranged alternately with the inlet opening 280 or extraction opening 250.

An advantage of the FIG. 5 embodiment is that a flow of gas radially outwardly from the inlet openings 280 to the extraction openings 250 passes over the constriction between the upper surface 262 of the radially inward part of the second seal member 260 and the substrate W. This results in an acceleration of the gas flow, thereby enhancing the sealing capability because any liquid which does find its way radially inward of extraction openings 250 is pushed by the accelerated gas flow back radially outwards towards the extraction opening 250 if the force generated by the gas flow is greater than the capillary force of the liquid between the upper surface 232 and the substrate W.=

In the embodiment of FIG. 5, instead of or in addition to the extraction openings 250 being positioned in the second seal member 260, the plurality of inlet openings 280 can be positioned in the first seal member 230. This arrangement has similar advantages to the arrangement illustrated in FIG. 5 as the gas flow radially outward from the inlet openings 280 towards the extraction openings 250 must pass through the narrow gap between the first seal member 230 and the substrate W so that the gas flow is accelerated thereby enhancing the sealing capability of the arrangement.

In an alternative embodiment, the groove 252 may be replaced with a plurality of recesses similar to the recesses 284 described below with reference to FIG. 6 and the inlet openings 280.

Figure 6:
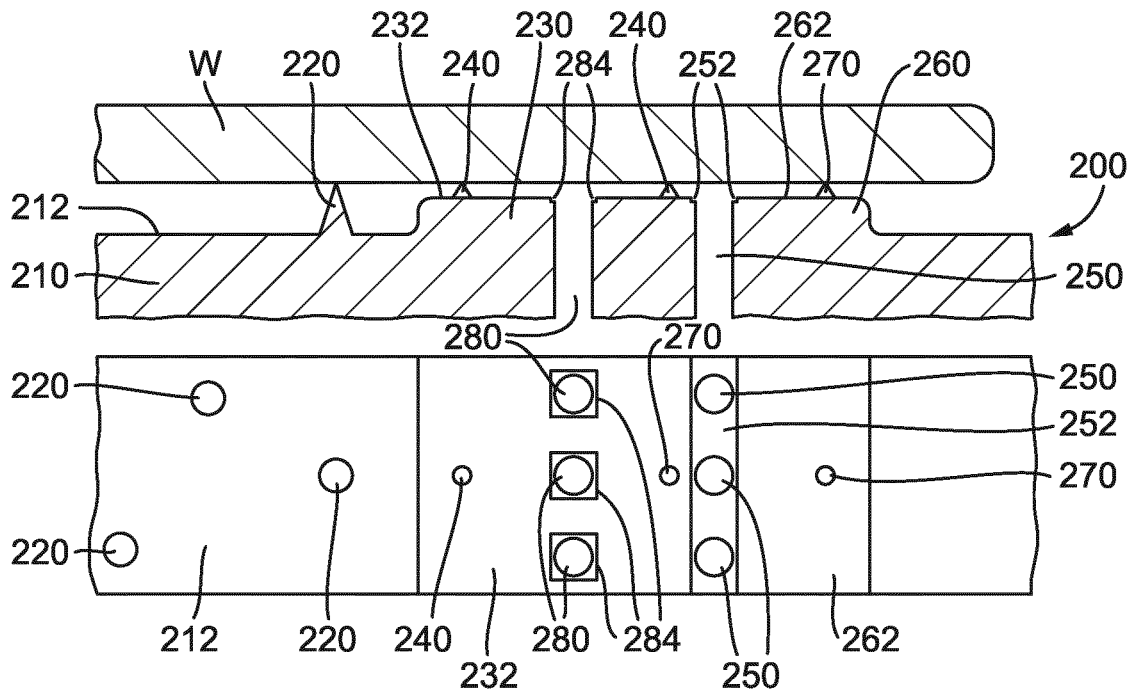
FIG. 6 depicts a schematic overview of an edge of a substrate holder 200 according to the present invention.

The embodiment of FIG. 6 is the same as the embodiment of FIG. 5 except as described below.

In the embodiment of FIG. 6 the arrangement of the extraction openings 250 in the bottom of a groove 252 formed in the upper surface 262 of the second seal member 260 is the same as in the embodiment of FIG. 5. However instead of the inlet openings 280 being provided in the bottom of a deep recess between the first seal member 230 and second seal member 260, the inlet openings 280 in the embodiment of FIG. 6 are provided at the bottom of individual recesses 284 formed in the upper surface 232 of the first seal member 230. This embodiment can be viewed as having a first seal member 230 in which the inlet openings 280 are formed, a second seal member 260 with no inlets or openings formed in it, and a shallow groove 252 with extraction openings 250 formed in the bottom of the groove 252 between the first seal member 230 and second seal member 260.

The recesses 284 are a pressure divider and make the gas flow more defined in position. Additionally the recesses 284 create a tangential flow between the inlet openings 280. This tangential flow can remove liquid from between the inlet openings 280. This effect is also achieved with the groove 252.

Although the arrangement illustrated shows that each recess 284 has a corresponding inlet opening 280, the arrangement may be different whereby one recess 284 has two or more associated inlet openings 280.

In this and all other embodiments the minor burls 240 may be arranged alternately with the inlet openings 280, rather like the outer burls 300 being arranged alternately with the extraction openings 250 in the embodiment of FIG. 9 described below. Additionally or alternatively the minor burls 240 may be positioned radially inwardly and/or radially outwardly of the inlet openings 280, as well as in a line at the same radial distance from the center of the substrate holder 200 as the inlet openings 280.

Figure 7:
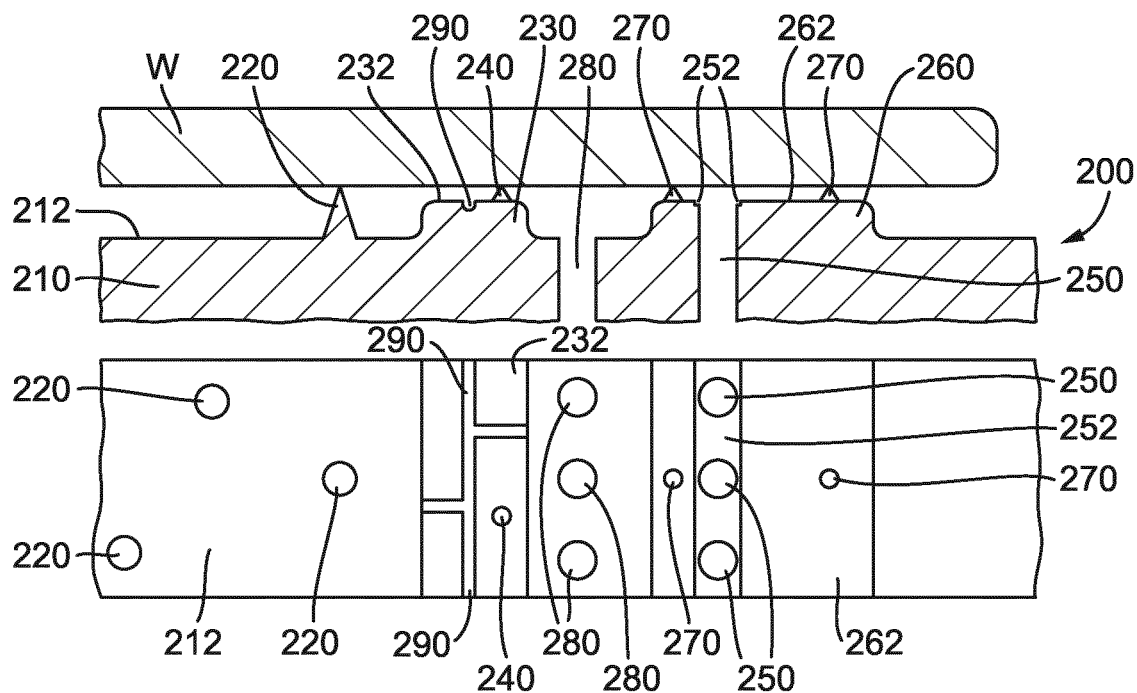
FIG. 7 depicts a schematic overview of an edge of a substrate holder 200 according to the present invention.

The embodiment of FIG. 7 is the same as the embodiment of FIG. 5 or 6 except as described below.

In FIG. 7 a groove 290 is formed in the upper surface 232 of the first seal member 230. The groove 290 does not have any openings formed in its bottom surface.

As can be seen in the lower half of FIG. 7, the groove 290 may have a shape to form a labyrinth seal for the first passage of gas from radially outward of the first seal member 230 to radially inward of the first seal member 230. That is, the groove 290 extends from a radially inward side of the first seal 230 to a radially outward side of the first seal member 230 following a tortuous path. As with all the other embodiments, the main burls 220 and/or minor burls 240, 270 may be arranged alternately with (and/or radially inwards/outwards of) the inlet opening 280 and/or extraction openings 250.

Figure 8:
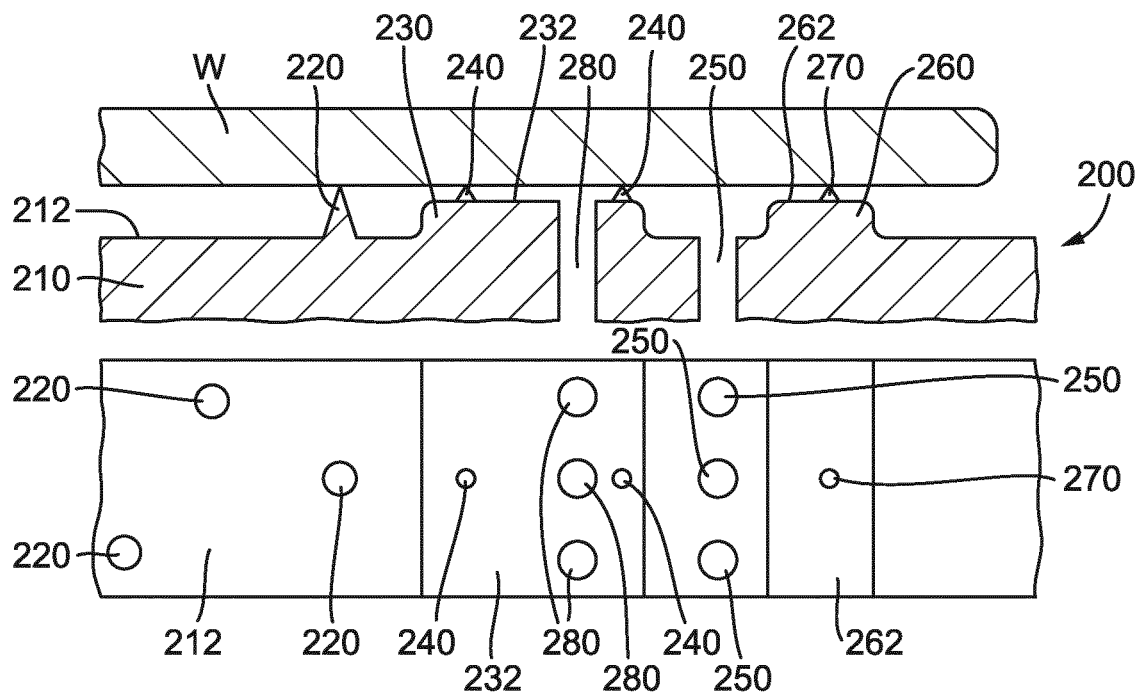
FIG. 8 depicts a schematic overview of an edge of a substrate holder 200 according to the present invention.

FIG. 8 illustrates an embodiment which is the same as the embodiment of FIG. 5 except as described below.

In the embodiment of FIG. 8 instead of having the extraction openings 250 formed in the upper surface 262 of the second seal member 260 and the inlet openings 280 formed between the first seal member 230 and second seal member 260, the extraction openings 250 are formed between the first seal member 230 and second seal member 260 and the inlet openings 280 are formed in the upper surface 232 of the first seal member 230. Like with the embodiment of FIG. 5 this can be seen as a three seal member embodiment. A continuous groove or individual recesses may or may not be provided in the upper surface 232 of the first seal member 230 with the inlet openings 280 formed in the bottom surface of the groove or individual recesses like shown and described with reference to FIG. 5 around the extraction openings 250. Minor burls 240 may be provided on the upper surface 232 of the first seal member 230 on one or both radially inward and outward sides of the extraction openings 280 (or alternatingly). Like the minor burls 270 on the second seal member 260 of the FIG. 5 embodiment, the minor burls 240 may or may not be radially aligned.

Figure 9:
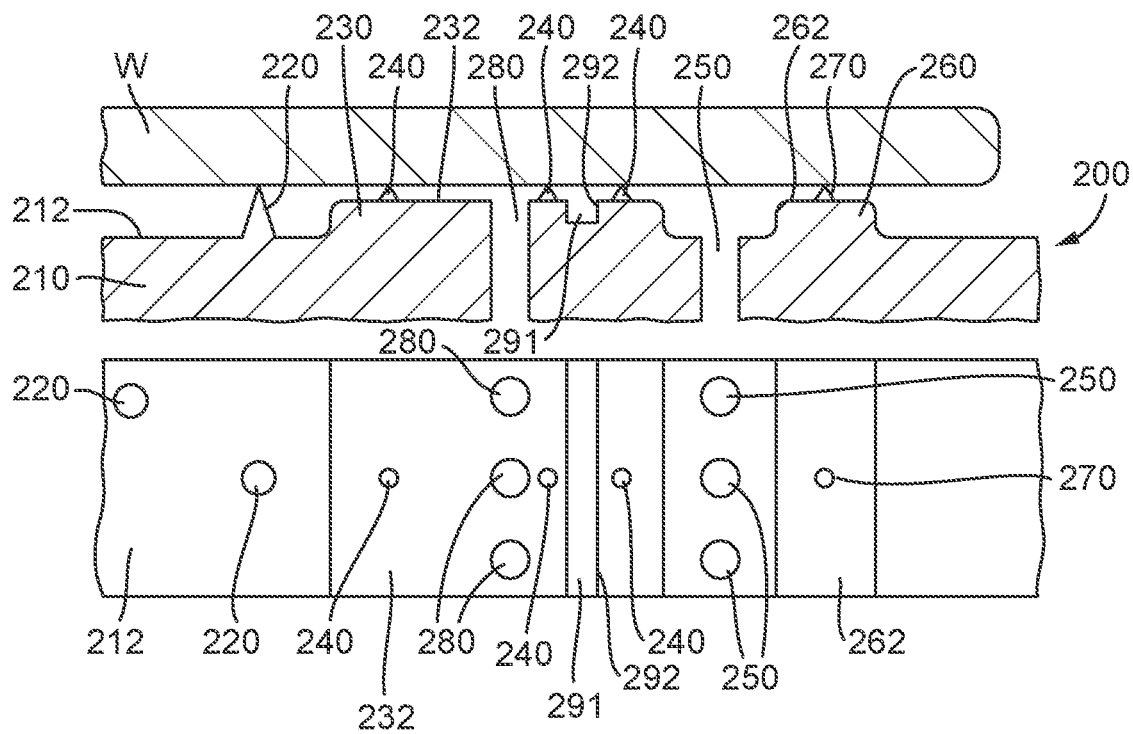
FIG. 9 depicts a schematic overview of an edge of a substrate holder 200 according to the present invention.

FIG. 9 illustrates an embodiment which is the same as the embodiment of FIG. 8 except as described below.

In the embodiment of FIG. 9, a meniscus pinning feature 290 is provided in the upper surface 232 of the first seal member 230. The meniscus pinning feature 290 extends around the region of the main burls 220. The meniscus pinning feature 290 is radially outward of the inlet openings 280. The meniscus pinning feature 290 is radially inward of the extraction openings 250.

The meniscus pinning feature 290 has a feature, for example a sharp edge 292, which is effective to pin a meniscus of liquid in place. The meniscus pinning feature 290 applies a force to the meniscus meaning that extra energy is required for the meniscus to move past the meniscus pinning feature 290. In this way, a further barrier to the radially inward movement of liquid is present.

As with the embodiment of FIG. 8, the minor burls 240 may be in any position on the upper surface 232 of the first seal member 230. Additionally or alternatively minor burls 270 may be present on the upper surface 262 of the second seal member 260.

In the embodiment of FIG. 9 the extraction openings 250 are held at an underpressure which is greater than the underpressure applied in the region of the main burls 220. In an embodiment an underpressure is also applied to the inlet openings 280. The underpressure applied to inlet openings 280 has a magnitude which is between that of the underpressure applied in the region of the main buds 220 and that applied to the extraction openings 250. In this way, a flow of gas is generated radially outwardly past the inlet openings 280. This radially outward flow of gas presents another force on the meniscus of liquid between the substrate W and the substrate holder 200.

Although the meniscus pinning feature 290 is illustrated as a groove with a sharp edge 292, any feature which functions as an meniscus pinning feature 290 may be used. An alternative feature may be a change in contact angle of the upper surface 262 with the immersion liquid at the position of the meniscus pinning feature 290.

An meniscus pinning feature 290 such as that illustrated in FIG. 9 could be used in any of the other embodiments. The position of the meniscus pinning feature 290 is best located radially inwardly of the extraction openings 250.

Figure 10:
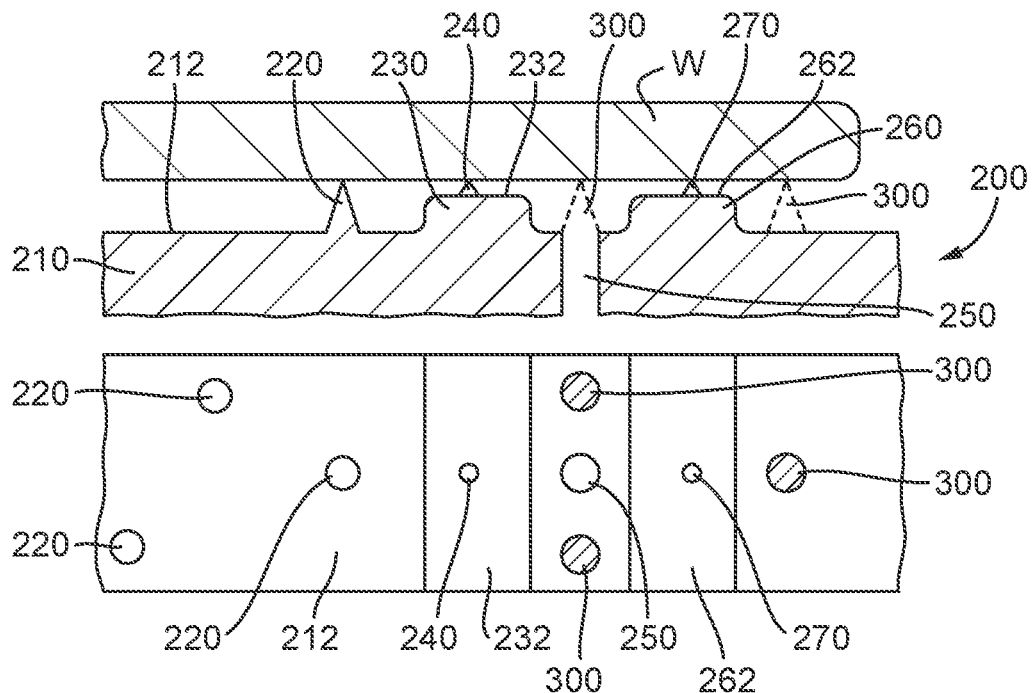
FIG. 10 depicts a schematic overview of an edge of a substrate holder 200 according to the present invention.

The embodiment of FIG. 10 is the same as the embodiment of FIG. 3 except as described below.

In the embodiment of FIG. 10 minor burls 240, 270 are optional features. Instead or additionally, in order to support the edge of the substrate W radially further outward than the outer most main burl 220, a plurality of outer burls 300 are provided radially outward of the first seal member 230. The plurality of outer burls 300 project from the main body surface 212. Each of the plurality of outer burls 300 has a distal end surface configured to support the substrate W. The plurality of outer burls 230 may be provided radially inward of the second seal member 260, as illustrated. In one embodiment the plurality of outer burls 300 are arranged alternately with the extraction openings 250 in a line surrounding the first seal member 230 and the main burls 220.

In this way the edge of the substrate W has a support. This can reduce deformation of the substrate W at its outer edge. In an embodiment the outer burls 300 may be positioned radially outward of the second seal member 260. An outer burl 300 such as that illustrated in FIG. 10 may optionally be provided in the embodiments as described with reference to FIGS. 3-9 and 11-13.

Figure 11:
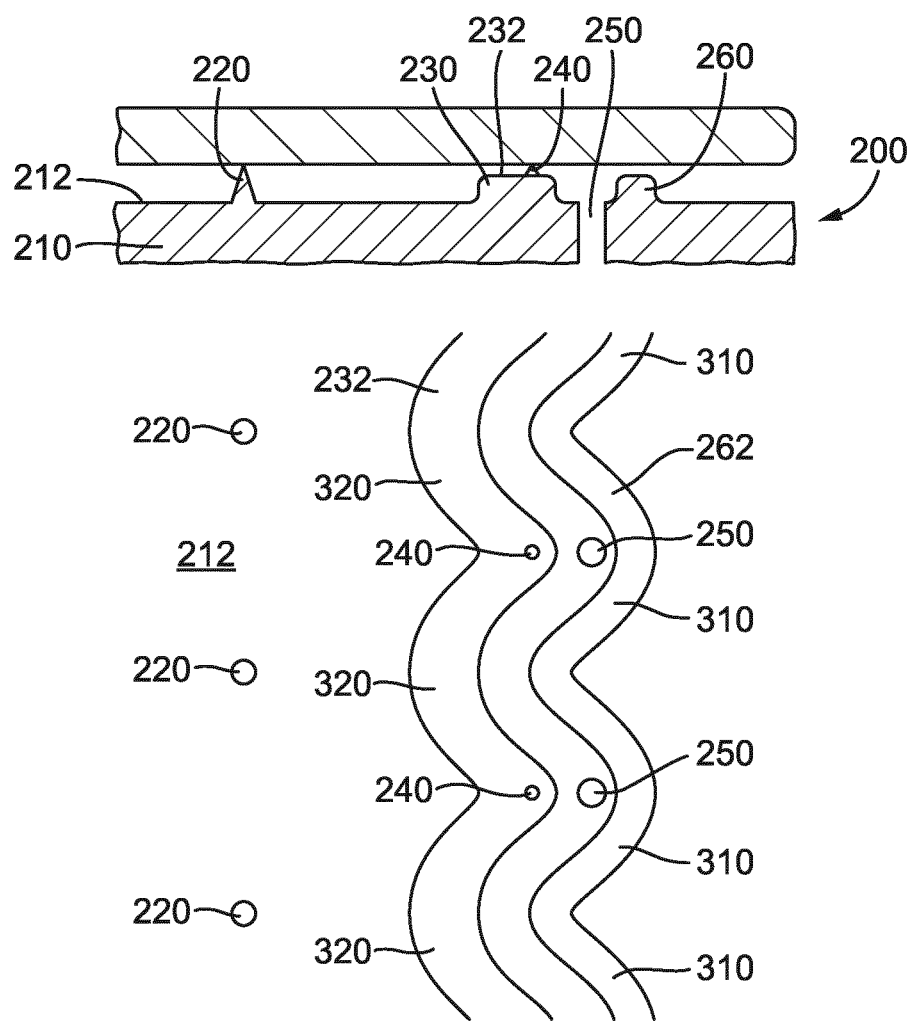
FIG. 11 depicts a schematic overview of an edge of a substrate holder 200 according to the present invention.

FIG. 11 illustrates an embodiment which is the same as the embodiment of FIG. 10 except as described below.

The variation in the geometry of the first seal member 230 and/or second seal member 260 illustrated in FIG. 11 and described below can be applied to the first seal member 230 and/or second seal member 260 of any of the embodiments.

In the embodiment of FIG. 11, as can be seen in the lower portion of that Figure, the second seal member 260 follows a meandering path around the circumference of the substrate holder 200. As also illustrated in FIG. 11, minor burls 240 are formed on the top surface 232 of the first seal member 230. The minor burls 240 are positioned at apexes, for example where adjacent concave curved portions 320 meet. Thus, the plurality of minor burls 240 project from parts of the first seal member 230 which extend further from the center of the substrate holder 200 than other parts of the first seal member 230. The first seal member 230 and the second seal member 260 may have any shape. What is desirable is that the minor burls 240 positioned on the first seal member 230 are positioned on a circumferential line which has an equal area of the groove between the first seal member 230 and second seal member 260 radially inwards of it as radially outward of it. Therefore the underpressure generated between the first seal member 230 and the second seal member 260 is equal on either side of the line of minor burls 240, so that no great bending moment is introduced due to the large underpressure in the area between the first seal member 230 and second seal member 260.

In one embodiment, the first seal member 230 is formed by a plurality of concave curved portions 320 joined together. In one embodiment, the second seal member 260 has an overall shape, in plan, which is defined by a plurality of curved portions 310 having a smaller radius than the overall shape, which are joined together thereby to form the overall shape. The second seal member 260 is formed of a plurality of convex curved portions 310 (relative to the radial direction from inward to outward of the substrate holder 200).

Inlet openings 280 may also be provided, for example radially inward of the extraction openings 250 between the first seal member 230 and the second seal member 260.

Figure 12:
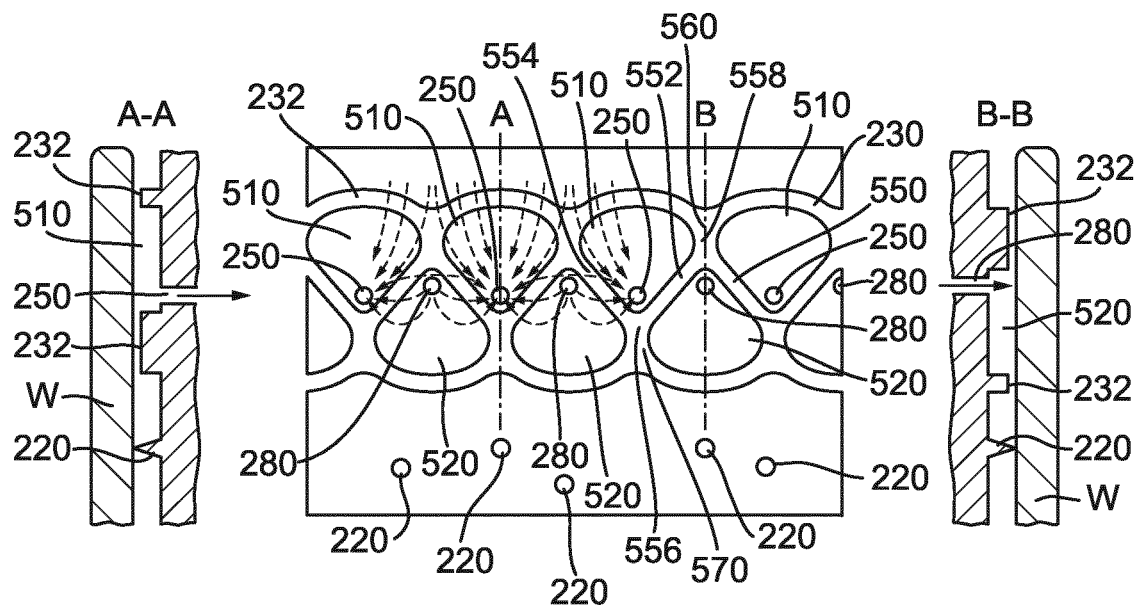
FIG. 12 depicts a schematic overview of an edge of a substrate holder 200 according to the present invention.

The embodiment of FIG. 12 incorporates features of the embodiment of FIG. 6 as well as the embodiment of FIG. 11.

The embodiment of FIG. 12 has a single seal member 230. The single seal member 230 is shown in plan in the middle of FIG. 12 and in cross-section on the left and right hand sides of FIG. 12. The left hand cross-section is through line A-A illustrated in the plan view of FIG. 12. The right had side of FIG. 12 illustrates the cross-section through line B-B in the plan view of FIG. 12.

The seal member 230 includes a plurality of inlet openings 280 in the upper surface 232. Extraction openings 250 are also formed in the upper surface 232 of the seal member 230. The inlet openings 280 may be connected to an ambient pressure source or an underpressure which the has a lower magnitude than an underpressure to which extraction openings 250 are connected.

In the embodiment of FIG. 12 one or more first recesses 510 are formed in the upper surface 232 of the seal member 230. Each of the first recesses 510 has at least one associated extraction opening 250. However there may be more than one extraction opening 250 in the or each first recess 510.

One or more second recesses 520 are formed in the upper surface 232 of the seal number 230. Each of the second recesses 520 has one or more corresponding inlet opening 280 formed in it. However there may be more than one inlet opening 280 in the or each second recess 520.

The first and second recesses 510, 520 are shaped and positioned to result in a barrier 550 being formed between the first recesses 510 and the second recesses 520. The barrier 550 is configured to restrict the passage of liquid between the substrate W and the main body surface 212 radially inwardly past the barrier 550.

Due to the relatively higher pressure of gas in the inlet openings 280, gas is sucked out of the inlet openings 280 over the barrier 550 towards the extraction openings 250. This flow of gas is accelerated as it passes over the barrier 550, thereby forming an effective gas seal between the barrier 550 and the underside of the substrate W. The gas flow advantageously has a tangential component from the inlet openings 280 towards the extraction openings 250 so as to direct radially incoming fluid towards the extraction openings 250.

The relative positioning of the plurality of extraction openings 250 and inlet openings 280 and the size and shape of the barrier 550 result in the fluid flows illustrated by arrows in the plan view of FIG. 12. That is, due to the underpressure applied to the extraction openings 250, fluid is sucked from radially outside of the seal member 230 into the extraction openings 250 and focused by tangential movement towards the extraction openings 250.

In an embodiment, first extensions 560 extend from the barrier 550 radially outwardly. Second extensions 570 extend from the barrier 550 radially inwardly. The first extension 560 and the second extension 570 are effective to define sidewalls of the first recess 510 and the second recess 520, respectively. The first extension 560 bridges from the barrier 550 to a radially outer portion of the seal member 230. The second extension 570 bridges from the barrier 550 to a radially inner portion of the seal member 230.

The inlet openings 280 and extraction openings 250 alternate in the circumferential direction such that gas drawn out of an inlet opening 280 flows towards extraction openings 250 on either side of that inlet opening 280. In this way a tangential flow of gas is achieved substantially around the entire circumference of the seal member 230 resulting in superior sealing properties.

Due to each extraction opening 250 being formed in a first recess 510, and the extraction openings 250 being spaced closely next to each other around the circumference of the seal member 230, the force experienced by the substrate W due to the underpressure applied to the extraction openings 250 is evened out in the circumferential direction resulting in lower deformation of the substrate W.

Due to the inlet openings 280 being positioned in the bottom of a corresponding second recess 520, the gas flow out of the inlet openings 280 is spread out over a larger area of the barrier 550 than if the inlet openings 280 were not formed in a second recess 520.

Optionally the inlet openings 280 are spaced radially outward of the extraction openings 250. This helps in splitting of the radially incoming fluid flow into two streams towards adjacent extraction openings 250. This splitting of the fluid flow towards one of two extraction openings 250 is also aided by the shape of the barrier 550 and also the (optional) presence of the first extensions 560, explained further below.

So that the extraction openings 250 may be radially inward of the inlet openings 280, the one or more first recesses 510 extend radially inward so that the innermost part of the first recesses 510 is closer to the center of the substrate holder 200 than the outermost part of the one or more second recesses 520. The shape of the first recess 510 and the second recess 520 includes a tangential narrowing towards the center of the substrate W in the case of the first recesses 510 and away from the center of the substrate W in the case of second recesses 520.

The barrier 550 can be seen as forming a side wall of the first recesses 510 on one side (radially outward) and a side wall of the second recess 520 on the other side (radially inward). The side wall is formed by sets of first portion 552 and second portion 554 of the barrier 550.

The first portion 552 and the second portion 554 of a set converge on one another towards a respective first apex 556 as the first portion 552 and the second portion 554 extend in the radially inward direction. By positioning one of the plurality of extraction openings 250 adjacent the first apex 556, the flow of fluid radially inwardly is directed by the first portion 552 and the second portion 554 as well as by the flow of gas from the inlet openings 280 towards the extraction openings 250. This directing of the flow of fluid towards the extraction openings 250 results in better extraction efficiency of the extraction openings 250. The flow of gas is also aided by the first extension 510 as this forms a tangential barrier to the flow of fluid.

First portion 552 and second portion 554 of adjacent sets also converge on one another towards a respective second apex 558 of the barrier 550 as the first portion 552 and the second 554 portion extend in the radially outward direction. Advantageously each of the second apexes 558 has an associated inlet opening 280.

The first extensions 560 extend from the second apexes 558. The second extensions 570 extend from the first apexes 556.

Also helping with guiding of the fluid flow towards the extraction openings 250 is the overall shape, in plan, of the seal member 230. That is, a radially outer most part of the seal member 230 varies in distance from the center of the substrate holder 200. This results in the wavy pattern illustrated in the plan view of FIG. 12. The extraction openings 250 are positioned circumferentially aligned with parts of the seal member 230 which extend further from the center of the substrate holder 200 than other parts of the seal member 230. That is, an imaginary line (such as line A-A) passing through the center of the substrate holder 200 passes through an extraction opening 250 and through a radially outer most part of the seal member 230. A similar arrangement is optionally made, as illustrated, on the inner surface of the seal member 230 with the inlet openings 280 being radially aligned with parts of the seal member 230 which extend closer to the substrate holder 200 than other parts of the seal member 230.

Although not illustrated, the seal member 230 of the embodiment of FIG. 12 may comprise a plurality of minor burls 240, such as discussed in connection with the other embodiments of the present invention. The minor burls 240 may be positioned radially inwardly and/or radially outwardly of the extraction openings 250 and/or inlet openings 280 or may be positioned substantially in line with the inlet openings 280 and/or extraction openings 250.

Figure 13:
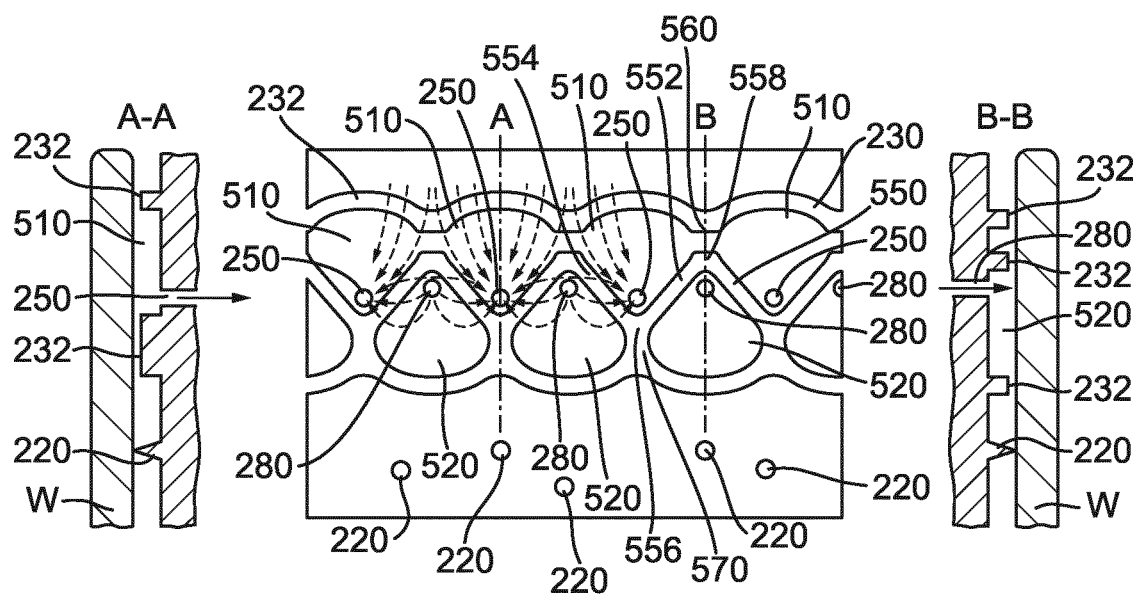
FIG. 13 depicts a schematic overview of an edge of a substrate holder 200 according to the present invention.

The embodiment of FIG. 13 is the same as the embodiment of FIG. 12 except that only a single first recess 510 is formed. That is, the first extension 560 is missing. Alternatively or additionally the second extension 570 may be missing.

Embodiments are provided according to the following clauses:

1. A substrate holder for use in a lithographic apparatus and configured to support a substrate, the substrate holder comprising:
   a main body having a main body surface;
   a plurality of main burls projecting from the main body surface, wherein each main burl has a distal end surface configured to support the substrate;
   a first seal member projecting from the main body surface and having an upper surface, the first seal member surrounding the plurality of main burls and configured to restrict the passage of liquid between the substrate and the main body surface radially inward past the first seal member; and
   a plurality of minor burls projecting from the upper surface of the first seal member, wherein each minor burl has a distal end surface configured to support the substrate.

2. The substrate holder of clause 1, further comprising a plurality of extraction openings formed in the main body for the extraction of fluid into the main body from between the main body and the substrate.

3. The substrate holder of clause 2, wherein the plurality of extraction openings are arranged radially outward of the first seal member, and/or wherein the substrate holder further comprising a second seal member projecting from the main body surface, the second seal member having an upper surface and surrounding the plurality of main burls and configured for restricting the passage of liquid between the substrate and the main body surface radially inward past the second seal member.

4. The substrate holder of clause 3, wherein the second seal member surrounds the first seal member, and preferably wherein the substrate holder further comprises a plurality of second minor burls projecting from an or the upper surface of the second seal member, and each second minor burl has a distal end surface configured to support the substrate, and preferably wherein the plurality of extraction openings are in the upper surface of the second seal member.

5. The substrate holder of clause 4, wherein each extraction opening is formed at a bottom surface of an extraction groove formed in the second seal member or wherein each extraction opening is formed at a bottom surface of a corresponding recess formed in the upper surface of the second seal member.

6. The substrate holder of clause 2, wherein the plurality of extraction openings are arranged radially inward of the first seal member.

7. The substrate holder of clause 2 or clause 6, further comprising a second seal member projecting from the main body surface, the second seal member surrounding the plurality of main burls and configured for restricting the passage of liquid between the substrate and the main body surface radially inward past the second seal member.

8. The substrate holder of clause 7, wherein the first seal member surrounds the second seal member, and/or wherein the second seal member has an upper surface and the substrate holder further comprises a plurality of second minor burls projecting from the upper surface of the second seal member, wherein each second minor burl has a distal end surface configured to support the substrate.

9. The substrate holder of any of clause 4, clause 6, clause 7 or clause 8, wherein the plurality of extraction openings are in the main body surface between the first seal member and the second seal member.

10. The substrate holder of any of clauses 2 to 9, further comprising a plurality of outer burls projecting from the main body surface, wherein each outer burl has a distal end surface configured to support the substrate, the outer burls being radially outward of the first seal member, and preferably wherein the outer burls and the extraction openings are arranged alternately in a line surrounding the first seal member and the plurality of main burls.

11. The substrate holder of any of clauses 2 to 10, further comprising a plurality of inlet openings formed in the main body for the drawing therethrough of gas to a space between the substrate and the main body, and preferably wherein the substrate holder further comprising a plurality of inlet openings formed in the main body for the drawing therethrough of gas to a space between the substrate and the main body.

12. The substrate holder of clause 11, wherein the plurality of inlet openings are formed in the main body surface radially outward of the first seal member, or wherein the plurality of inlet openings are in the upper surface of the first seal member, and preferably wherein the plurality of inlet openings are provided at the bottom of individual recesses formed in the upper surface of the first seal member.

13. The substrate holder of any of clauses 1 to 12, further comprising a groove formed in the upper surface of the first seal member, wherein the groove provides a tortuous path for gas from a radially outward side of the first seal member to a radially inward side of the first seal member, and/or wherein the first seal member has an overall shape, in plan, such that a radially outer most part of the first seal member varies in distance from the center of the substrate holder around its circumference and wherein the plurality of minor burls project from parts of the first seal member which extend further from the center of the substrate holder than other parts of the first seal member.

14. The substrate holder of any of clauses 1 to 13, further comprising a meniscus pinning feature on the upper surface of the first seal member.

15. A lithographic apparatus including a substrate holder of any of clauses 1-14.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A substrate holder for use in a lithographic apparatus and configured to support a substrate, the substrate holder comprising:
   a main body having a main body surface;
   a plurality of first burls projecting from the main body surface, each first burl having a distal end surface configured to support the substrate;
   a first seal member projecting from the main body surface at an edge region of the main body and having an upper surface arranged to be spaced apart by a first gap from the substrate when the substrate is supported by the plurality of first burls, the first seal member surrounding the plurality of first burls;
   a plurality of second burls arranged outwards of the first seal member, each second burl having a distal end surface configured to support the substrate;
   a second seal member projecting from the main body surface at the edge region of the main body and having an upper surface arranged to be spaced apart by a second gap from the substrate when the substrate is supported by the plurality of first burls, the second seal member surrounding the first seal member and the plurality of second burls, the second seal member arranged to be below the substrate when the substrate is supported by the plurality of first burls, and the first gap arranged to be fluidly connected to the second gap when the substrate is supported by the plurality of first burls; and
   at least one extraction opening for the extraction of fluid into the main body from between the main body and the substrate, the at least one extraction opening located between the first seal member and the second seal member or in the upper surface of the second seal member.

2. The substrate holder of claim 1, further comprising at least one third burl arranged outwards of the second seal member, the at least one third burl having a distal end surface configured to support the substrate.

3. The substrate holder of claim 1, wherein the at least one extraction opening comprises a plurality of extraction openings in the upper surface of the second seal member.

4. The substrate holder of claim 3, wherein the plurality of extraction openings and at least one second burl of the plurality of second burls are arranged alternately in a line surrounding the first seal member and the plurality of first burls.

5. The substrate holder of claim 3, wherein each extraction opening is formed at a bottom surface of an extraction groove formed in the second seal member.

6. The substrate holder of claim 3, wherein each extraction opening is formed at a bottom surface of a corresponding recess formed in the upper surface of the second seal member.

7. The substrate holder of claim 3, further comprising a plurality of inlet openings formed in the main body inward of the plurality of extraction openings, the plurality of inlet openings open to the atmosphere or connected to a gas source.

8. The substrate holder of claim 1, wherein the at least one extraction opening comprises a plurality of extraction openings arranged between the first seal member and the second seal member.

9. The substrate holder of claim 1, further comprising a plurality of minor burls, wherein at least one of the minor burls projects from the upper surface of the first seal member, and each minor burl has a distal end surface configured to support the substrate.

10. The substrate holder of claim 9, wherein at least one of the minor burls projects from the upper surface of the second seal member.

11. The substrate holder of claim 10, wherein at least one of the minor burls of the first seal member and at least one of the minor burls of the second seal member are lined up in a radial direction or staggered relative to one another in the radial direction, respectively.

12. The substrate holder of claim 1, further comprising a groove formed in the upper surface of the first seal member, wherein the groove provides a tortuous path for gas from an outward side of the first seal member to an inward side of the first seal member.

13. The substrate holder of claim 1, further comprising a meniscus pinning feature on the upper surface of the first seal member.

14. A lithographic apparatus comprising:
   A projection system configured to transfer a pattern toward a substrate; and
   the substrate holder of claim 1.

15. A substrate holder for use in a lithographic apparatus and configured to support a substrate, the substrate holder comprising:
   a main body having a main body surface;
   a plurality of first burls projecting from the main body surface, each first burl having a distal end surface configured to support the substrate;
   a first seal member projecting from the main body surface and having an upper surface arranged to be spaced apart by a first gap from the substrate when the substrate is supported by the plurality of first burls, the first seal member located outward, relative to a center of the main body, of the plurality of first burls;
   a plurality of second burls arranged outwards, relative to the center of the main body, of the first seal member, each second burl having a distal end surface configured to support the substrate;
   a second seal member projecting from the main body surface and having an upper surface arranged to be spaced apart by a second gap from the substrate when the substrate is supported by the plurality of first burls, the second seal member located outwards, relative to the center of the main body, of the first seal member and the plurality of second burls, the second seal member arranged to be below the substrate when the substrate is supported by the plurality of first burls, and the first gap arranged to be fluidly connected to the second gap when the substrate is supported by the plurality of first burls; and
   at least one extraction opening for the extraction of fluid into the main body from between the main body and the substrate, the at least one extraction opening located between the first seal member and the second seal member or in the upper surface of the second seal member.

16. The substrate holder of claim 15, further comprising at least one third burl arranged outwards, relative to the center of the main body, of the second seal member, the at least one third burl having a distal end surface configured to support the substrate.

17. The substrate holder of claim 15, wherein the at least one extraction opening comprises a plurality of extraction openings in the upper surface of the second seal member.

18. The substrate holder of claim 15, wherein the at least one extraction opening comprises a plurality of extraction openings arranged between the first seal member and the second seal member.

19. The substrate holder of claim 15, wherein the plurality of extraction openings and at least one second burl of the plurality of second burls are arranged alternately in a line surrounding the first seal member and the plurality of first burls.

20. A lithographic apparatus comprising:
   A projection system configured to transfer a pattern toward a substrate; and
   the substrate holder of claim 15.

* * * * *

UNITED STATES PATENT AND TRADEMARK OFFICE
CERTIFICATE OF CORRECTION

PATENT NO. : 11,139,196 B2
APPLICATION NO. : 16/650939
DATED : October 5, 2021
INVENTOR(S) : Niek Jacobus Johannes Roset et al.

Page 1 of 1

It is certified that error appears in the above-identified patent and that said Letters Patent is hereby corrected as shown below:

On the Title Page

On Page 2 and in Item (56) References Cited - FOREIGN PATENT DOCUMENTS, Column 2, Line 32, replace "WO I2017102162 06/2017" with --WO 2017102162 06/2017--

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*